United States Patent [19]

Gipp et al.

[11] Patent Number: 4,633,224
[45] Date of Patent: Dec. 30, 1986

[54] ABSOLUTE AND INCREMENTAL OPTICAL ENCODER

[75] Inventors: Gregory H. Gipp; John F. Szentes, both of Peoria, Ill.

[73] Assignee: Caterpillar Inc., Peoria, Ill.

[21] Appl. No.: 730,888

[22] Filed: May 6, 1985

[51] Int. Cl.$^4$ .................................. G02F 7/00
[52] U.S. Cl. ..................... 340/347 P; 250/231 SE
[58] Field of Search .............. 340/347 P; 250/231 SE

[56] References Cited

U.S. PATENT DOCUMENTS

| | | | |
|---|---|---|---|
| 2,986,726 | 5/1961 | Jones | 340/347 P |
| 3,303,347 | 2/1967 | Wingate | 250/220 |
| 3,310,798 | 3/1967 | Wingate | 340/347 |
| 3,534,360 | 10/1970 | Hafle | 340/347 P |
| 4,101,764 | 7/1978 | Nelle | 250/237 |
| 4,335,306 | 6/1982 | Gort | 340/347 P |
| 4,445,110 | 4/1984 | Breslow | 340/347 |
| 4,524,347 | 6/1985 | Rogers | 340/347 P |

*Primary Examiner*—Charles D. Miller
*Attorney, Agent, or Firm*—Terry D. Morgan

[57] ABSTRACT

An apparatus optically detects the position of a movable element through the use of six discrete tracks. Each of the tracks is formed on a glass substrate and has a preselected pattern of optically transmissive and opaque sections arranged thereon. A light source and optical sensors are associated with each of the tracks such that the light is either blocked or passed to the optical sensors respectively responsive to the opaque and transmissive sections. Five of the tracks correspond to form a five bit absolute gray code pattern indicative of the position of the movable element. The sixth remaining track has alternately opaque and transmissive sections arranged to form an incremental track where the count of the number of opaque and transmissive sections travelling past an initial set point is maintained in memory and corresponds to an incremental position within each of the absolute positions. The microprocessor base controller limits the number of incremental transitions within an absolute position to thirty-two or two to the fifth power. The thirty-two possible positions, when used as the lower five bits of a ten bit binary word, where the upper five bits come from the five absolute tracks, forms a ten bit pseudo-gray code indicative of the position of the movable element and is highly accurate without the necessity of ten absolute tracks and the cumbersome packaging associated therewith.

8 Claims, 7 Drawing Figures

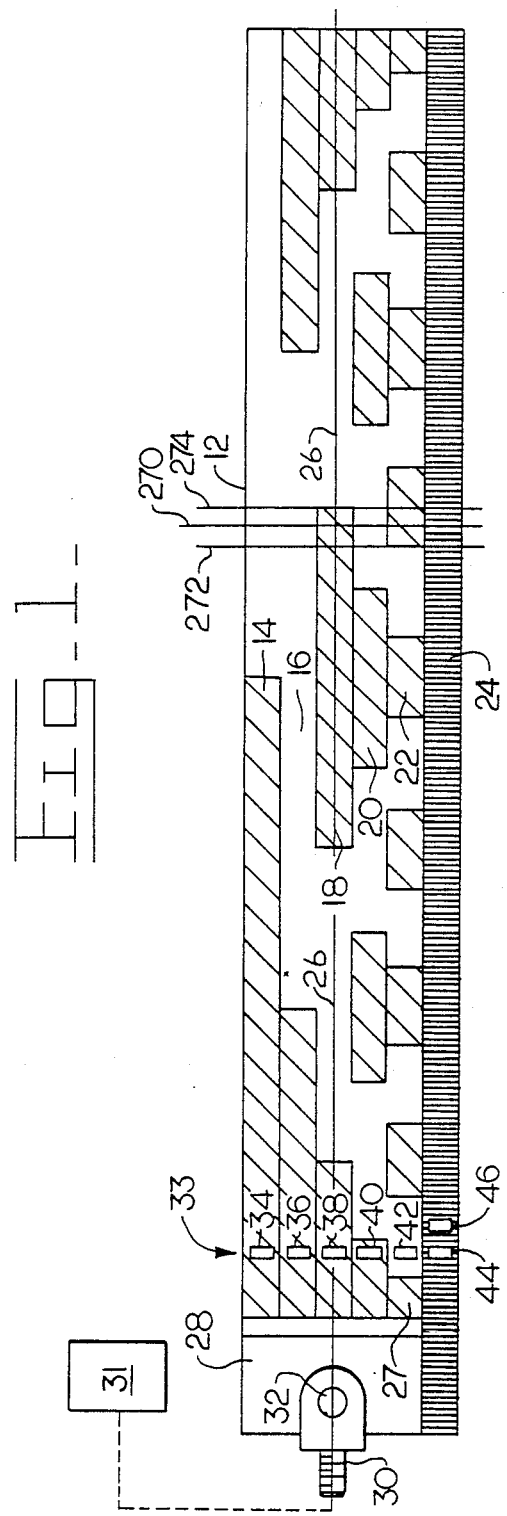

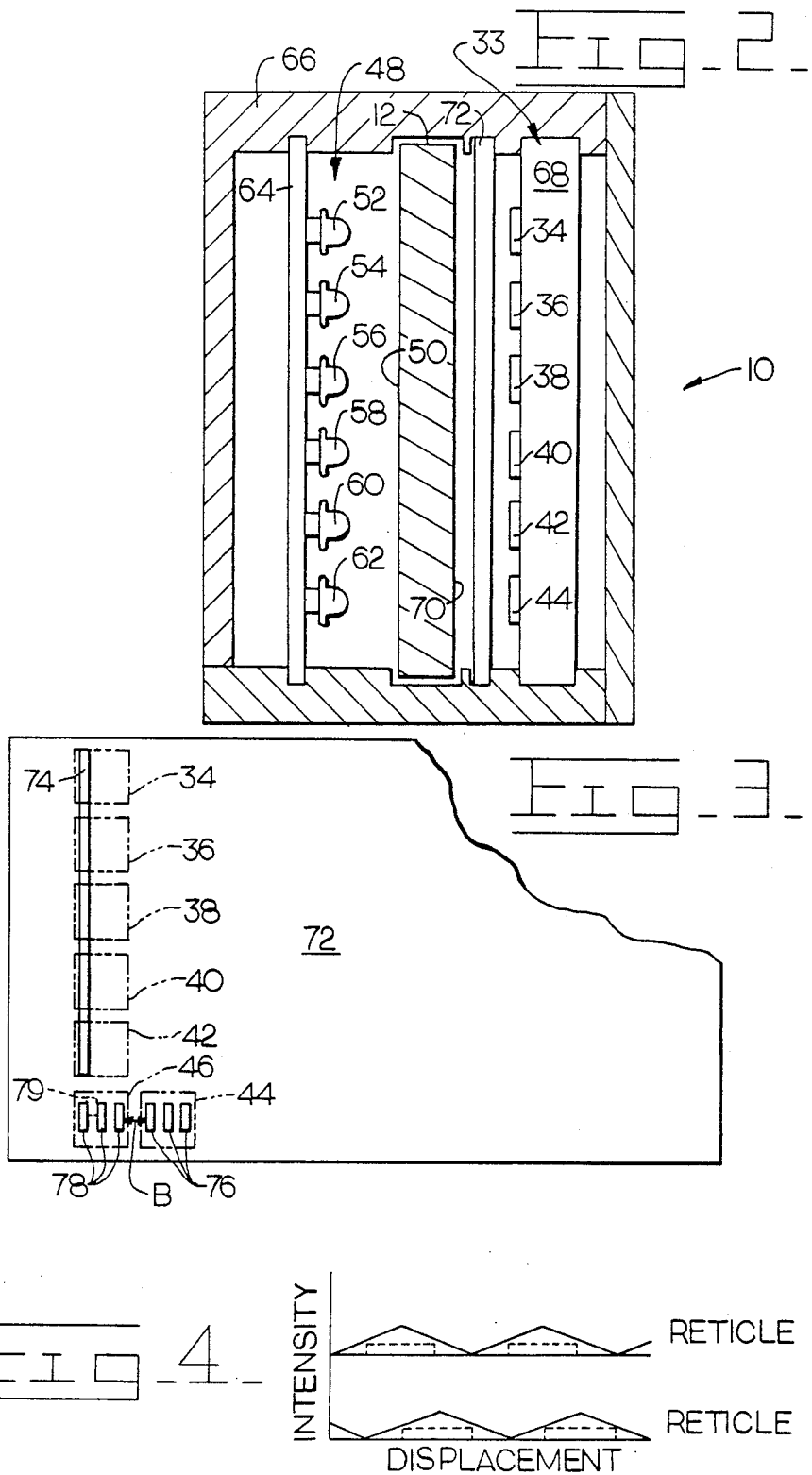

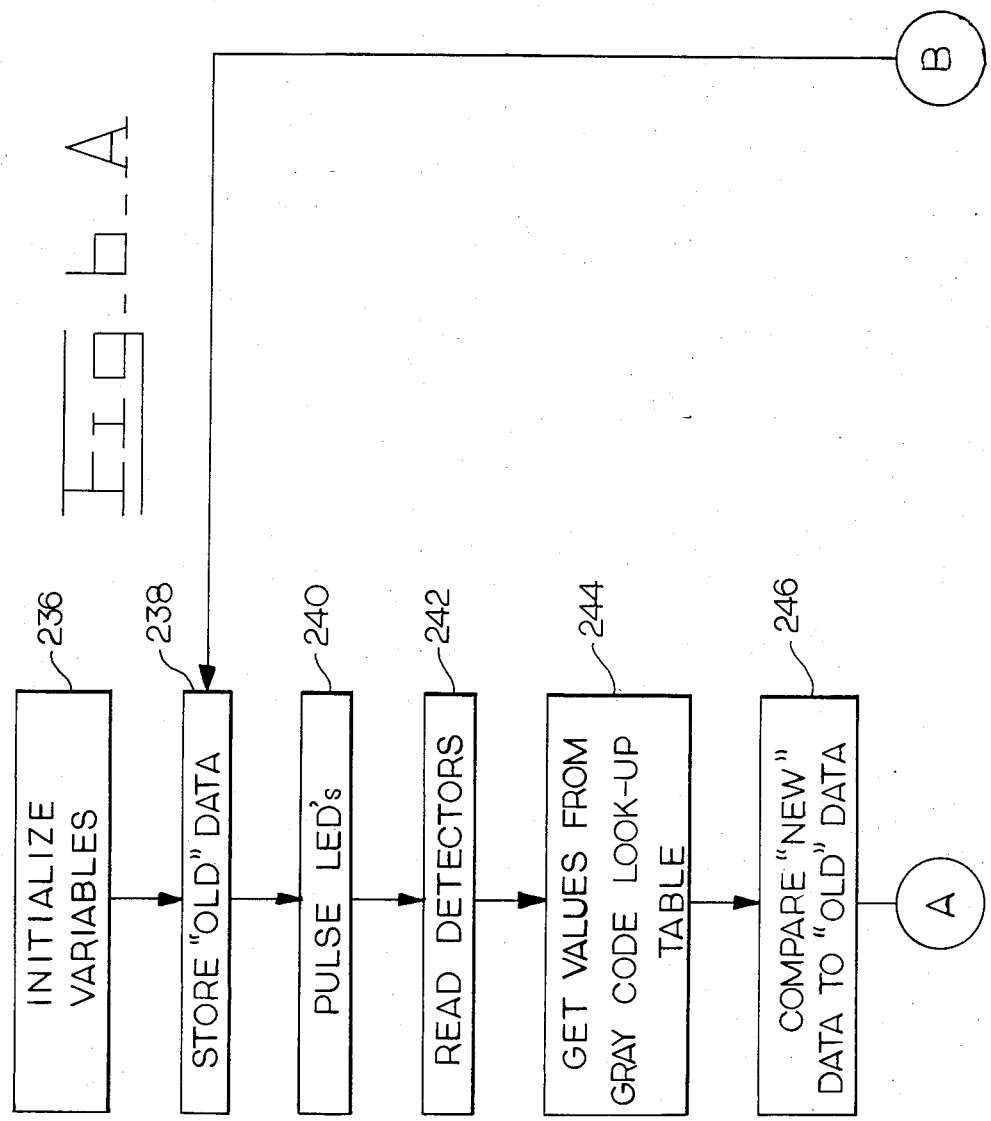

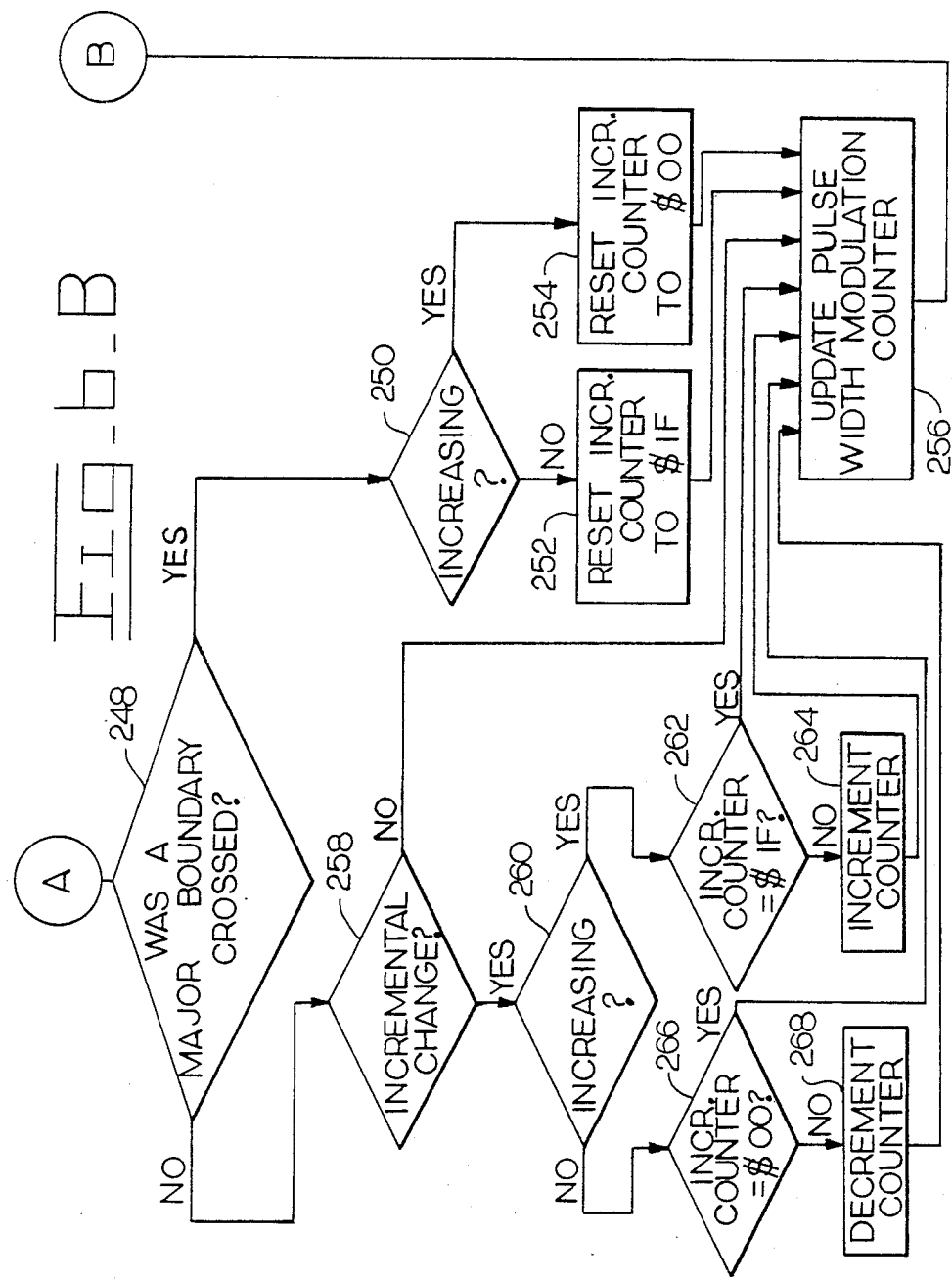
Fig_B

ABSOLUTE AND INCREMENTAL OPTICAL ENCODER

TECHNICAL FIELD

This invention relates generally to an apparatus for optically detecting the position of a movable element and more particularly to the apparatus having a scale with a plurality of absolute tracks and an incremental track for enhancing accuracy.

BACKGROUND ART

In the field of optical position detectors, two types of detectors are in common use and each has problems peculiar to its design. The first of these detectors is commonly known as an absolute encoder. "Absolute" referring to the ability of the encoder to recognize the position of a movable element without referring to a base, home, or starting position. These absolute encoders typically include a scale with alternating opaque and optically transmissive sections arranged in a particular pattern along a series of tracks. The scale is movable along a path which positions each of the tracks intermediate a light source and corresponding photodetectors. The opaque and transmissive sections control the state of the photodetectors by either blocking or passing light resulting in a corresponding off or on condition of the photodetectors. The on/off status of the photodetectors correspond to a 1/0 condition such that a combination of all the photodetectors forms a unique binary number indicative of the position of the scale. The pattern of the opaque and transmissive sections are typically arranged in a gray or straight binary code depending upon the complexity and desired accuracy of the encoder. However, while the choice of the coding scheme has some influence on the accuracy of the encoder, the maximum degree of accuracy is ultimately a function of the number of tracks and the magnitude of travel. Assuming a linear encoder is to be designed which requires a length of travel (L) and physical packaging restraints limit the number of tracks to (N). Then the equation:

degree of accuracy $= L/2^n$ determines the maximum achievable accuracy. For example, an element movable through a stroke of 5 cm requiring a degree of accuracy of $\pm 1$ MM must include six tracks.

$$2^n = \frac{5\ CM}{.1\ CM} = 50.0$$

$$n = 5.644$$

$$n \approx 6$$

Eliminating tracks from the exemplified encoder reduces the accuracy of the system by a factor of two for each track removed. As one might guess, as the number of tracks increases, the accuracy increases, as does the cost, complexity, and physical package size of the encoder For systems requiring long travel or high accuracy, the absolute encoder would need a large number of tracks resulting in the encoder becoming unwieldy and difficult to physically locate.

Alternatively, a second type of encoder is commercially available and commonly referred to as an incremental encoder. These incremental encoders overcome many of the shortcomings of the absolute encoders, but in so doing introduce a number of problems unique to their design. Incremental encoders ordinarily include a single track of alternating opaque and optically transmissive sections arranged along a scale so as to be sequentially introduced between a light source and a photodetector, affecting the state of the photodetector in much the same way as in the absolute encoders. Because the incremental encoders include only a single track, a unique multiple digit binary number indicating absolute position cannot be formed, but position can be determined relative to some preselected starting point simply by counting the number of opaque and transmissive sections passing the photodetector. Obviously, some provision for detecting direction of travel must be included in the design to allow the count to be consistently incremented or decremented relative to the direction of travel. Accuracy of incremental encoders is controlled by the width of the opaque and transmissive sections which can be made extremely fine and limited only by the ability of the photodetector to recognize a change from an opaque to a transmissive section. Therefore, accuracy of an incremental encoder may be greatly enhanced without a corresponding increase in physical size or complexity.

However, the shortcoming of this type of encoder lies in the inherent inability to calculate absolute position without referring to a known starting position. This requirement forces the device to be returned to a starting position during an initial start up period. After a period of power loss, the encoder is hopelessly lost until returned to the starting position.

For example, position encoders are typically employed for detecting governor position of an engine. Using an incremental encoder can give the accuracy necessary to provide stable engine control, but each time the engine is started, the governor must be initially positioned at some preselected starting location. This is an inconvenience to the operator; however, if during actual operation, electrical power is momentarily lost, then the incremental encoder will not indicate movement of the rack which has occurred and will result in false position information being provided to the governor control. If the error is significant, engine operation outside of a preferred range could occur and cause damage or even failure of the engine or drive train.

Further, as the accuracy of the device is increased, the ability of the electronic circuitry to detect movement and direction becomes increasingly difficult and susceptible to error. For example, switching noise ambient light, or RFI interference could mask a change from opaque to transmissive and result in an occasional missed count. While the accuracy of the system is high, a single missed count will have only a small effect on accuracy; unfortunately, the errors are cumulative. This cumulative error becomes larger the longer the device is operated and can only be compensated for by periodic calibrations during operation. The operator must periodically return to the starting position to remove the cumulative error. This is an annoyance to the operator and in some applications an impossibility.

The present invention is directed to overcoming one or more of the problems as set forth above.

DISCLOSURE OF THE INVENTION

In accordance with one aspect of the present invention, an apparatus for detecting the position of a movable element has a scale with first and second opposed sides and a plurality of discrete tracks. Each of the tracks has a plurality of optically transmissive and opaque sections arranged in a preselected pattern. One of the tracks alternates between the opaque and optically transmissive sections at a rate greater than twice that of any of the remaining tracks. The scale is connected to and movable with the movable element along a preselected pathway. A source of electromagnetic radiation is positioned adjacent the first side of the scale and directed generally toward the scale pathway. A plurality of sensing means each deliver a preselected signal in response to a selected one of the optically transmissive and opaque sections of each respective track being positioned intermediate the source of electromagnetic radiation and the corresponding sensing means. A processing means receives the signals, calculates an absolute position in response to receiving signals corresponding to the remaining tracks, and an incremental position in response to receiving signals corresponding to the one track. The processing means then delivers an enhanced position signal in response to a combination of the absolute and incremental positions.

Position encoders have heretofore relied upon technologies involving the sensing of either absolute or incremental position of a movable element. Each of the technologies has advantages and disadvantages which complement one another as previously described. The apparatus of this invention has advantageously combined the two technologies and created a new third technology that is free from the shortcomings of each of its parents.

BRIEF DESCRIPTION OF THE DRAWINGS

FIG. 1 illustrates one embodiment of a scale having both absolute and incremental encoding;

FIG. 2 is an end view of the instant apparatus;

FIG. 3 is a side view of the reticle;

FIG. 4 is a graph representing the intensity of light delivered through the reticles corresponding to the incremental track;

FIGS. 6A and 6B show one embodiment of a flowchart of a software routine for implementing the apparatus.

BEST MODE FOR CARRYING OUT THE INVENTION

Figure 5:
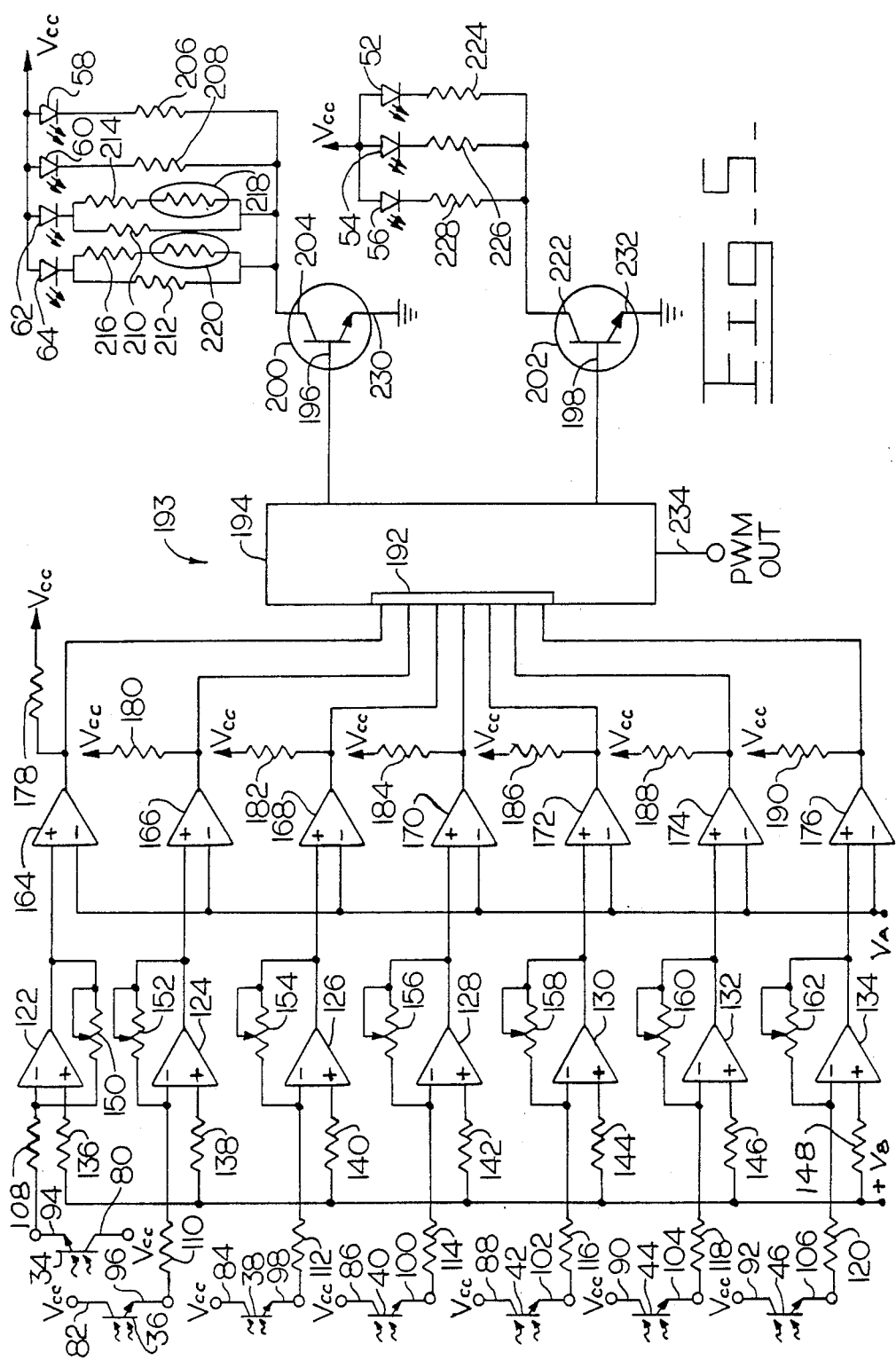
FIG. 5 is a schematic of one embodiment of the electrical circuitry involved in producing and detecting the electromagnetic radiations.

Referring now to the drawings, wherein a preferred embodiment of the apparatus 10 is shown, FIG. 1 illustrates a scale 12 with a plurality of discrete tracks 14,16,18,20,22,24 which extend along the length of the scale 12 and parallel to a longitudinal axis 26. The illustrated embodiment defines six separate tracks 14,16,18,20,22,24, each track formed from a plurality of optically transmissive and opaque sections arranged in a unique preselected pattern. One of the tracks, here track 24, for example, alternates between the opaque and transmissive sections at a rate greater than twice that of any of the remaining tracks 14,16,18,20,22.

The width of the opaque and transmissive sections of the tracks 14,16,18,20,22,24 is defined as that dimension which lies on a line parallel to the longitudinal axis 26 of the scale 12. Further, the widths of the sections of a first portion of the tracks 14,16,18,20,22 are preferably identical and one such section is illustrated as the first opaque section 27 of the least significant track 22. The opaque and transmissive sections of the one track 24 have a width less than one-half the width of the sections of the first portion of the tracks 14,16,18,20,22. Further, the width of the sections of the one track 24 is defined as the width of the sections of the first portion of the tracks 14,16,18,20,22 divided by $2^n$ where n is a positive integer.

Information on incremental movement of the scale is extracted from the one track 24 and is described in greater detail in conjunction with FIGS. 4 and 6. Similarly, absolute positional information is interpreted from the first portion of the tracks 14,16,18,20,22 and is detailed with respect to FIG. 6.

The absolute scale is formed from the first portion of the tracks 14,16,18,20,22, each of which is constructed from thirty-two separate sections of sixteen opaque and sixteen transmissive sections which differ only in the order in which they are presented. For example, the least significant track 22 has a pattern of two opaque and two transmissive sections repeated eight times. The next significant track 20 has a pattern of four opaque and four transmissive sections repeated four times. The remaining tracks are similarly organized such that there are thirty-two unique patterns of opaque and transmissive sections arranged along the longitudinal axis 26. The choice of thirty-two patterns is not random, but reflects the number of possible conditions (opaque or transmissive) raised to a power equal to the number of tracks (5). Therefore, $2^5=32$ represents the maximum number of unique patterns.

A careful inspection of the pattern reveals that changes between opaque and transmissive sections occur in all of the tracks 18,20,22, but in only a single track at any transverse location along the longitudinal axis. This coding scheme is commonly referred to as gray code and is useful, in that if multiple tracks were allowed to change simultaneously, then extraordinary care would be required to insure that the changes occurred at precisely the same moment.

Any misalignment would lead to the introduction of positional errors if one of the changes preceded the other change. For example, in a natural binary coding scheme, a change from the eighth to ninth position would require that all of the bits change simultaneously (e.g., 0111-1000). Since structure which guide the scale 12 must allow sufficient "play" to prevent binding, this "play" can result in a skewed motion of the scale 12 such that all of the bits do not change simultaneously. The actual code could appear to change from 0111 to 0110 to 0100 to 0000 to 1000. The scale would seem to have changed from position 8 to position 7 to position 5 to position 0 and finally to position 9, when, in reality, the scale merely moved from position 8 to position 9.

In the preferred embodiment, the scale 12 is constructed from a glass substrate and the opaque sections are formed on the substrate by a precise inking process. Clearly, the transmissive sections are simply the absence of the inking process. Alternately, a chrome plating can be applied to the glass substrate with the transmissive sections being formed by etching away the chrome plating. A first end portion 28 of the scale 12 is mechanically attached to a link assembly 30 via an opening 32 in the glass substrate. The scale 12 is connected to and movable along the longitudinal axis 26 with a movable element 31 via the link assembly 30. The movable element could be, for example, a rack of a fuel injection system which controls the quantity of fuel delivered to a prime mover. Electronic engine controls typically operate with some type of feedback to insure that a desired rack position is actually achieved. The instant apparatus 10 can be used to provide instantaneous positional information having a degree of accuracy which results in stable engine operation. A variety of applications exist for position encoders separate from engine controls. The examples given here are purely for explanatory purposes and are not intended to limit the apparatus 10 to a particular field of use.

A plurality of sensing means 33 each deliver a preselected signal in response to a selected one of the optically transmissive and opaque sections of each respective track 14,16,18,20,22,24 being positioned intermediate a source of electromagnetic radiation 48 (FIG. 2) and the corresponding sensing means. The sensing means 33 includes a plurality of photodetectors 34,36,38,40,42,44,46, each being disposed along one of the tracks 14,16,18,20,22,24 with the track 24 including two photodetectors 44,46 disposed to receive light at a 90° phase relationship relative to the opaque sections of the one incremental track 24.

FIG. 2 depicts a schematic view of an end portion of the apparatus 10 and better illustrates the relationship of the scale 12, sensing means 33, and the electromagnetic source of radiation 48. The radiation source 48 is positioned adjacent a first side 50 of the scale 12 and directed generally toward the scale pathway. A plurality of light emitting diodes (LED) 52,54,56,58,60,62 make up the radiation source 48 and are positioned on a printed circuit board 64 at respective locations opposite the tracks 14,16,18,20,22,24.

The LED's 52,54,56,58,60,62 preferably emit light in the infrared spectrum and the photodetectors 34,36,38,40,42,44,46 are correspondingly sensitive to infrared light. The board 64 is securely fastened in a housing 66 to prevent motion relative to the housing 66. The photodetectors 34,36,38,40,42,44,46 are similarly secured to a second printed circuit board 68 which is likewise secured to the housing 66 to prevent relative motion and thereby disturb the alignment of the LED photodetector pair. The second printed circuit board 68 is positioned opposite the first PC board adjacent a second opposed side 70 of the scale 12.

Light from the diodes 52,54,56,58,60,62 is respectively delivered to the tracks 14,16,18,20,22,24 of the movable scale 12. Light falling on the opaque sections of the tracks 14,16,18,20,22,24 is blocked and light falling in the transmissive sections pass to the respective photodetectors 34,36,38,40,42,44,46.

A reticle 72 is disposed between the second side 70 of the scale 12 and the second PC board 68. The reticle 72 functions to prevent light emitted by the LED's 52,54,56,58,60,62 from being received by a photodetector 34,36,38,40,42,44 other than the photodetector 34,36,38,40,42,44 corresponding to that particular LED 52,54,56,58,60,62. Erroneous energization of the photodetectors 34,36,38,40,42,44 by ambient light is also minimized by the reticle 72.

A frontal view of the reticle 72 is shown in FIG. 3. The photodetectors' position in the assembled housing 66 are shown by phantom lines with the photodetectors 34,36,38,40,42 positioned immediately adjacent a first reticle 74. The remaining photodetectors 44,46 are shown positioned immediately adjacent respective second and third group of reticles 76,78.

Each of the individual reticles has a width substantially similar to the width of the opaque or transmissive sections of the incremental track 24. These reticles 76,78 correspond to the one incremental track 24. Within each of the groups 76,78 the spacing between the individual reticles is selected to be a distance 79 that is an odd integer multiple of the width of one of the opaque or transmissive sections of the incremental track 24. Preferably, the distance 79 is identical to the width of one of the opaque or transmissive sections, so that the reticles within each of the groups 76,78 responds in like manner to movement of the scale 12.

The purpose of including multiple reticles within each of the groups 76,78 is to allow a greater intensity of light to fall on the photodetectors 44,46, consequently increasing the sensitivity of the photodetectors 44,46 to movement of the scale 12. The number of reticles which can be used is limited by the physical size of the photodetectors 44,46 and the width of the opaque and transmissive sections of the track 24.

FIG. 3 illustrates the groups 76,78 with three reticles, but this is done to provide clarity to the drawing and in the actual embodiment the number of reticles is determined from the limitations set forth above. The distance between the groups of reticles 76,78 is defined by the equation:

$$1.1 \quad B = A(x+0.75)$$

where X is a positive integer, B is the distance between the second and third groups of reticles 76,78, and A is the combined width of one opaque and one optically transmissive section of the incremental track 24.

The position of the groups of reticles 76,78, and particularly the distance B between the groups 76,78, allows the signals delivered by the photodetectors 44,46 to be translated into direction of travel and incremental movement. Referring to FIG. 4, a graph of light intensity versus scale displacement for both the second and third reticles 76,78 is shown. The trace for the third reticle 78 shows zero intensity at zero displacement while the second reticle trace illustrates one-half of maximum intensity at zero displacement. At zero displacement the third reticle is aligned with the opaque sections of the track 24 blocking all light, while the second reticle is positioned according to equation 1.1 such that the opaque sections of track 24 block only one-half of the transmitted light.

Inspection of the traces of FIG. 4 reveals that the second and third reticle traces are identical but 90° out of phase due to the distance B between the second and third reticles. Squaring the sawtooth waveforms of FIG. 4 yields the square waves shown as dashed lines, which better illustrate the ability to detect the direction of travel and incremental movement. First, a value of "1" is assigned to the square waves at one-half of maximum intensity and a value of "0" is assigned to the square waves at zero intensity. Movement along the displacement axis from zero toward maximum yields a unique 2-bit code constructed from the values (0,1) of the second and third reticles (e.g., 00,01,11,10). This code represents movement of the scale for a distance corresponding to the combined width of one opaque and one transmissive section of the track 24 and is repeated for each such transition.

Direction can be inferred from the code by comparing the previous value to the current value. For example, if the previous code is 01 and the current code is 11, then the scale 12 has moved 1 incremental unit toward maximum displacement. Alternatively, if the current value is 00, then the scale 12 has moved 1 incremental unit toward zero displacement.

Similar rules are established for each of the codes and programmed into a microprocessor 194. The microprocessor 194 is additionally programmed to have a sampling rate sufficiently fast to insure that, at the scale's maximum rate of travel, only a single incremental transition will occur. One must also recognize that because there are four unique codes (00,01,11,10) within a transition of one opaque and one transmissive section, then a change in the code corresponds to a movement of the scale by a distance of one-half the width of an opaque or transmissive section of the track 24.

Referring to FIG. 5, one embodiment of an electrical schematic of the apparatus 10 is shown. The photodetectors 34,36,38,40,42,44,46 are shown with each of the collectors 80,82,84,86,88,90,92 connected to a supply voltage $V_{cc}$ and emitters 94,96,98,100,102,104 respectively connected through respective resistors 108,110,112,114,116,118,120 to the negative inputs of respective operational amplifiers 122,124,126,128,130,132,134. The positive inputs of amplifiers 122,124,126,128,130,132,134 are connected to a second supply voltage $V_B$ via respective resistors 136,138,140,142,144,146,148. Adjustable negative feedback is provided to amplifiers 122,124,126,128,130,132,134 by respective potentiometers 150,152,154,156,158,160,162. The enhanced outputs of the operational amplifiers 122,124,126,128,130,132,134 is delivered to positive inputs of corresponding comparators 164,166,168,170,172,174,176 and the negative inputs are connected to a reference voltage1 $V_A$. The outputs of the comparators 164,166,168,170,172,174,176 are connected to the supply voltage $V_{cc}$ via respective pull up resistors 178,180,182,184,186,188,190 and to a processing means 193. The means 193 includes a microprocessor 194 with the outputs of the comparators 164,166,168,170,172,174,176 connected, in particular, to a parallel input port 192 of the microprocessor 194.

Under software control (described in detail in conjunction with the flowcharts of FIGS. 6A & 6B), the microprocessor periodically energizes the LED's 52,54,56,58,60,62,64 by delivering a signal to the bases 196,198 of transistors 200,202. The collector 204 of transistor 200 is connected through resistors 206,208,210,212 and LED's 58,60,62,64 to the supply voltage $V_{cc}$. Additionally, the LED's 62,64 each have a resistor 214,216 connected in series with a thermistor 218,220, both of which are respectively connected in parallel with resistors 210,212. Similarly, the collector 222 of transistor 202 is connected to the supply voltage $V_{cc}$ through LED's 52,54,56 via respective resistors 224,226,228. Both transistors 200,202 have emitters 230,232 connected to ground.

An output port 234 of the microprocessor 194 is used to deliver a signal which has a duration corresponding to the magnitude of the sensed displacement. This type of coding is commonly referred to as pulse width modulation (PWM) and is only one type of signal coding which is not intended to be a limitation and is used only to exemplify one method of providing suitable output signals. Other methods known to those skilled in the art of electronic design can be employed without departing from the spirit of the invention.

Referring to FIGS. 6A & 6B, a computer program, embodying the illustrated flowchart, controls the processing means 193 to receive the signals from the photodetectors 34,36,38,40,42,44,46, calculate an absolute position in response to the signals corresponding to the remaining tracks 14,22 and an incremental position in response to the signals corresponding to the one track 24. An enhanced position signal is then developed by the processing means 193 by combining the absolute and incremental positions.

During the initialization phase 236 of the computer program, all variables are assigned a preselected starting value. Program control is transferred to a memory allocation portion of the software 238 where "old" data is stored. "Old" data being the previously calculated positional information which, during the initial iteration of the software routine, will be zero.

Control of the devices external to the microprocessor 194 is accomplished during phases 240,242 of the flowchart. The LED's 54,56,58,60,62,64 are pulsed "on" by delivering signals to the bases 196,198 of transistors 200,202. The parallel input port 192 is then "read" by the microprocessor 194 resulting in each of the photodetectors 34,36,38,40,42,44,46 being simultaneously accessed.

The importance of the photodetectors being simultaneously accessed is significant if one considers that the scale 12 is moving, and accessing the ports serially rather than in parallel could allow a sufficient period of time to transpire that the scale has moved sufficiently far to effect a change in one or more of the tracks resulting in a significant positional error.

The seven parallel bits of information corresponding to the photodetectors 34,36,38,40,42,44,46 are used to calculate a 10-bit pseudo-gray code word. The upper 5 bits of the word are a true gray code corresponding to the condition of the photodetectors 34,36,38,40,42 which represent the five absolute tracks 14,16,18,20,22. For example, at the location 270 on FIG. 1, the gray code pattern would be "$11010_2$". This absolute position code remains unchanged at any location between line 272 and line 274.

To augment this absolute position, the microprocessor 194 accesses the lower 2 bits of the seven bit word which correspond to the incremental track. There are thirty-two possible positions within the segment defined between the lines 272,274. These thirty-two positions, when converted to a base two number, require 5 bits (e.g. $2^5=32$). These 5 bits are natural binary and are used by the microprocessor to form the lower 5 bits of the 10-bit position word. For example, as described above, the line 270 is at absolute position "$11010_2$" and the incremental position is approximately "$01110_2$". The two 5-bit words combine to form the single 10 bit word "$1101001110_2$" or hexadecimal "$34E_{16}$".

The incremental count is natural binary and can achieve any value between $0_{10}-32_{10}$, $00000_2-11111_2$, or $00_{16}-1F_{16}$. Similarly, the absolute position can vary anywhere between the values $0_{10}-32_{10}$.

However, the use of gray coding does not allow a straight mathematical relationship between the gray code word and displacement. This is true simply because there is more than one unique gray code pattern; therefor, it is necessary to store a look-up table in the memory of the microprocessor 194 to provide a relationship between the gray code and the displacement of the scale 12. The gray code look-up table is accessed at phase 244 of the software routine.

Step 246 of the software routine compares the "old" data to the "new" data and then, in step 248, the program checks to determine if a major boundary was crossed. Crossing a major boundary refers to a change in the gray code pattern or more specifically a change in the absolute position. The processing means sets the calculated incremental position at a preselected value in response to a change in the calculated absolute position.

If the absolute value position has changed, control is transferred to step 250 where a determination is made as to whether the change was an increase or a decrease in the absolute position. An increasing position results in the incremental counter being set to the minimum value of $00_{16}$ in step 254. Conversely, if the change is decreasing, then the incremental counter is set to the maximum value of number $1F_{16}$ in step 252. In either case, the position of the scale has changed and a resulting change in the duration of the pulse width output must be effected to reflect the new position. Thus, control is transferred to step 256 which updates the PWM counter and alters the duration of the pulse.

One embodiment of the PWM counter is a software register which has a stored, preselected number. The microprocessor 194 outputs a "1" on the port 234 while simultaneously decrementing the register at a given rate. When the register is decremented to zero, the microprocessor 194 outputs a "0". By altering the count of the register, the duration of the output is controlled.

If after comparing the "new" data to the "old" data, a determination is made in step 248 that the absolute position has not changed, then program control is transferred to step 258 to determine if the scale 12 has moved. If the scale 12 has not moved, the PWM counter is updated with the previous count and the duration of the pulse remains unchanged.

A change in the scale position necessitates that the direction of the change be determined so that the incremental counter can be appropriately incremented or decremented at steps 264,268 of the software routine. However, the microprocessor 194 prevents the calculated incremental position from being set at the preselected value irrespective of changes in the position of the one track in the absence of a change in the calculated absolute position. For example, the incremental counter has previously been set to the value $1F_{16}$ and an incremental change is detected to be an increase in position without a corresponding change in the absolute position. Increasing the incremental counter would result in a value of $00_{16}$ with no change to the absolute position; hence, the 10-bit binary number would appear to have decreased by thirty-two bits rather than increase by one bit.

This particular phenomenon could occur as the result of RFI, ambient light, excess heat/cold, power surge or any number of commonly known electrical interference which may disturb the count of the incremental counter. To overcome this problem, step 262 prevents the counter from being incremented beyond $1F_{16}$ without a corresponding change in the absolute value. Similar problems arise in decrementing the incremental counter beyond $00_{16}$ since it would assume the value $1F_{16}$. Step 266 prevents the counter from being decremented beyond $00_{16}$ in the absence of a change in the absolute value.

INDUSTRIAL APPLICABILITY

In the overall operation of the apparatus 10, assume that the link assembly 30 is connected to a rack of a fuel injection system for controlling the quantity of fuel delivered to an engine and, for example, the speed of the engine. An operator of the engine requests a particular speed by positioning a control element, such as an accelerator pedal, at a preselected location. An engine control microprocessor monitors the accelerator pedal position and delivers a control signal to a positioning device (e.g. electrohydraulic, electromechanical, etc.). The control signals enable the positioning device to move the rack to a preselected position and cause the speed of the engine to approach the targeted desired speed.

The microprocessor 194 of the apparatus 10 constantly monitors the position of the scale 12 from which the position of the rack can be inferred. The duration of the pulse width signal on port 234 is periodically updated by the microprocessor 194 reflecting the current position of the rack. The engine control microprocessor receives the pulse width signal, measures the duration of the pulse, and calculates the rack position. The engine control then acts to alter the rate of movement, direction of movement, or stop the movement of the rack, depending upon the difference between the targeted and actual positions.

If power to the apparatus 10 is interrupted at any time during the operation of the engine, the microprocessor 194 loses the instantaneous incremental and absolute position from transient memory. After power is restored, the absolute position is immediately available; however, incremental position within the absolute position cannot be accurately determined until the scale 12 is moved past a major boundary.

At this time the incremental counter will be accurately reset to either $00_{16}$ or $1F_{16}$, depending upon direction of movement. The apparatus 10 will be relatively "lost". That is, the microprocessor "knows" the absolute position of the scale 12, but cannot accurately determine the incremental position. The accuracy of the apparatus 10 is greatly reduced for this short period of time such that control of the rack may be astable, but the accuracy is sufficient to prevent drastic incorrect movement of the rack by the engine control. Further, the accuracy is affected only momentarily and is restored when the scale 12 is moved a short distance.

Other aspects, objects, and advantages of this invention can be obtained from a study of the drawings, the disclosure, and the appended claims.

We claim:

1. An apparatus for detecting the position of a movable element, comprising:

a scale having first and second opposed sides and a plurality of discrete tracks, each track having a plurality of optically transmissive and opaque sections arranged in a preselected pattern, one of said tracks alternating between said opaque and optically transmissive sections at a rate greater than twice any of the remaining tracks, said scale being connected to and movable with said movable element along a preselected pathway;

a source of electromagnetic radiation positioned adjacent the first side of said scale and directed generally toward said scale pathway;

a plurality of sensing means each delivering a preselected signal in response to a selected one of said optically transmissive and opaque sections of the respective track being positioned intermediate said source of electromagnetic radiation and said corresponding sensing means; and processing means for receiving said signals, calculating an absolute position in response to receiving signals corresponding to the remaining tracks, and an incremental position in response to receiving signals corresponding to said one track, setting said incremental position to a minimum value in response to an increase in said absolute position irrespective of the calculated incremental position, setting said incremental position to a maximum value in response to a decrease in said absolute position irrespective of the calculated incremental position, and delivering an enhanced position signal in response to a combination of said absolute and incremental positions.

2. The apparatus, as set forth in claim 1, wherein said optically transmissive and opaque sections of the remaining tracks are arranged in a gray code pattern.

3. The apparatus, as set forth in claim 1, wherein said processing means, in the absence of a change in the calculated absolute position, blocks the calculated incremental position from being altered from the maximum to the minimum value irrespective of changes in position of said one track.

4. The apparatus, as set forth in claim 1, wherein said processing means, in the absence of a change in the calculated absolute position, blocks the calculated incremental position from being altered from the minimum to the maximum value irrespective of changes in position of said one track.

5. The apparatus, as set forth in claim 1, wherein said plurality of sensing means includes first and second photodetectors positioned adjacent the second side of said said scale along said one track spaced a preselected distance apart and first and second reticles respectively associated with said first and second photodetectors positioned intermediate said scale and said first and second photodetectors, said first and second reticles being spaced apart a preselected distance defined by the equation:

$$B = A\,(X + 0.75)$$

where:
X is a position integer;
B is the distance between the first and second reticles;
A is the combined width of one opaque and one optically transmissive section.

6. The apparatus, as set forth in claim 5, wherein said first and second photodetectors deliver first and second respective signals in response to the position of said optically transmissive and opaque sections of said one track, said processing means receives said first and second signals, calculates the direction of motion, and alters the incremental position by an amount corresponding to the direction and magnitude of movement of the movable element.

7. The apparatus, as set forth in claim 1, wherein said one track alternates between said optically transmissive and opaque sections at a rate of two raised to an nth power times that of the rate of any of the remaining tracks, wherein n is a positive integer.

8. An apparatus for detecting the position of a movable element, comprising:
a scale having first and second opposed sides and a plurality of discrete tracks, each track having a plurality of optically transmissive and opaque sections arranged in a preselected pattern, one of said tracks alternating between said opaque and optically transmissive sections at a rate greater than twice any of the remaining tracks, said scale being connected to and movable with said movable element along a preselected pathway;
a source of electromagnetic radiation positioned adjacent the first side of said scale and directed generally toward said scale pathway;
a plurality of sensing means each delivering a preselected signal in response to a selected one of said optically transmissive and opaque sections of the respective track being positioned intermediate said source of electromagnetic radiation and said corresponding sensing means; and
processing means for receiving said signals, calculating an absolute position in response to receiving signals corresponding to the remaining tracks, and an incremental position in response to receiving signals corresponding to said one track, setting said incremental position to a minimum value in response to an increase in said absolute position irrespective of the calculated incremental position, setting said incremental position to a maximum value in response to a decrease in said absolute position irrespective of the calculated incremental position, blocking the calculated incremental position from the being altered from the minimum to the maximum value and the maximum to the minimum value in the absence of a change in said absolute position irrespective of changes in position of said one track, and delivering an enhanced position signal in response to a combination of said absolute and incremental positions.

* * * * *